(12) United States Patent
Yeh

(10) Patent No.: US 12,575,026 B2
(45) Date of Patent: Mar. 10, 2026

(54) ELECTRONIC DEVICE

(71) Applicant: CARUX TECHNOLOGY PTE. LTD., Singapore (SG)

(72) Inventor: Hu-Shun Yeh, Tainan (TW)

(73) Assignee: CARUX TECHNOLOGY PTE. LTD., Singapore (SG)

( * ) Notice: Subject to any disclaimer, the term of this patent is extended or adjusted under 35 U.S.C. 154(b) by 197 days.

(21) Appl. No.: 18/535,361

(22) Filed: Dec. 11, 2023

(65) Prior Publication Data

US 2024/0237197 A1 Jul. 11, 2024

(30) Foreign Application Priority Data

Jan. 9, 2023 (CN) .......................... 202310026091.5

(51) Int. Cl.
*H05K 1/02* (2006.01)

(52) U.S. Cl.
CPC ........... *H05K 1/028* (2013.01); *H05K 1/0203* (2013.01); *H05K 2201/10136* (2013.01)

(58) Field of Classification Search
CPC ................. H05K 1/028; H05K 1/0203; H05K 2201/10136
USPC ........................................................ 361/749
See application file for complete search history.

(56) References Cited

U.S. PATENT DOCUMENTS

| | | | | |
|---|---|---|---|---|
| 5,100,492 A | * | 3/1992 | Kober | H05K 3/4691 |
| | | | | 29/829 |
| 2005/0168957 A1 | * | 8/2005 | Kawauchi | G02B 6/4292 |
| | | | | 361/783 |
| 2011/0122593 A1 | * | 5/2011 | van Lieshout | H05K 1/189 |
| | | | | 156/292 |
| 2012/0149981 A1 | * | 6/2012 | Khait | A61B 1/041 |
| | | | | 600/114 |
| 2023/0095842 A1 | * | 3/2023 | Baek | B60K 35/60 |
| | | | | 257/89 |

FOREIGN PATENT DOCUMENTS

CN          205229608 U          5/2016

* cited by examiner

*Primary Examiner* — Binh B Tran
(74) *Attorney, Agent, or Firm* — JCIPRNET

(57) ABSTRACT

An electronic device is provided. The electronic device includes a circuit board having two edges. The two edges correspond to each other and extend along a first direction. The circuit board includes a first flat zone, a second flat zone, a flexible zone between the first flat zone and the second flat zone, and two flexible zone gaps. The first flat zone has a first width. The flexible zone includes two flexible zone edges corresponding to each other. The two flexible zone gaps are formed on the two flexible zone edges, respectively. The two flexible zone gaps extend along a second direction that is perpendicular to the first direction. One of the flexible zone gaps has a first length, and the other flexible zone gap has a second length. The sum of the first length and the second length is less than half of the first width.

18 Claims, 8 Drawing Sheets

100

ELECTRONIC DEVICE

CROSS REFERENCE TO RELATED APPLICATIONS

This application claims the benefit of C.N. Application No. 202310026091.5, filed on Jan. 9, 2023, the entirety of which is incorporated by reference herein.

BACKGROUND OF THE INVENTION

Field of the Invention

The present disclosure relates to an electronic device, and, in particular, to an electronic device including a circuit board.

Description of the Related Art

As technology has improved, many electronic devices have grown in popularity. Examples of electronic devices include tablet computers, notebook computers, smartphones, display devices, and television sets. Typically, electronic devices have at least one circuit board with electronic elements on it, and the circuit board(s) may be used for supplying an electrical current.

BRIEF SUMMARY OF THE INVENTION

Some embodiments of the present disclosure provide an electronic device. The electronic device includes a back plate and a circuit board. The circuit board has two edges. The two edges correspond to each other and extend along a first direction. The circuit board is disposed relative to the back plate. The circuit board includes a first flat zone, a second flat zone, a flexible zone, and two flexible zone gaps. The first flat zone has a first width. The second flat zone has a second width. The flexible zone is disposed between the first flat zone and the second flat zone. The flexible zone is connected to the first flat zone and the second flat zone. The flexible zone includes two flexible zone edges corresponding to each other, and the two flexible zone edges are corresponding parts of the two edges that are in the flexible zone. The two flexible zone gaps are formed on the two flexible zone edges, respectively. The two flexible zone gaps extend along a second direction that is perpendicular to the first direction. One of the flexible zone gaps has a first length along the second direction, and the other flexible zone gap has a second length along the second direction. The sum of the first length and the second length is less than half of the first width Some embodiments of the present disclosure provide an electronic device. The electronic device includes a back plate and a circuit board. The circuit board has two edges. The two edges correspond to each other and extend along a first direction. The circuit board is disposed relative to the back plate. The circuit board includes a flat zone and a flexible zone. The flexible zone is connected to the flat zone. The flexible zone includes two flexible zone edges that correspond to each other and two flexible zone gaps formed on the two flexible zone edges, respectively. The two flexible zone edges are corresponding parts of the two edges that are in the flexible zone. The flexural strength of the flexible zone is different from the flexural strength of the flat zone.

BRIEF DESCRIPTION OF THE DRAWINGS

Features or advantages of the present disclosure can be more fully understood by reading the embodiments and examples with references made to the accompanying drawings. It should be noted that various features may be not drawn to scale. In fact, the dimensions of the various features may be arbitrarily increased or decreased for clarity of discussion, and the various features may be drawn schematically.

DETAILED DESCRIPTION OF THE INVENTION

Figure 1:
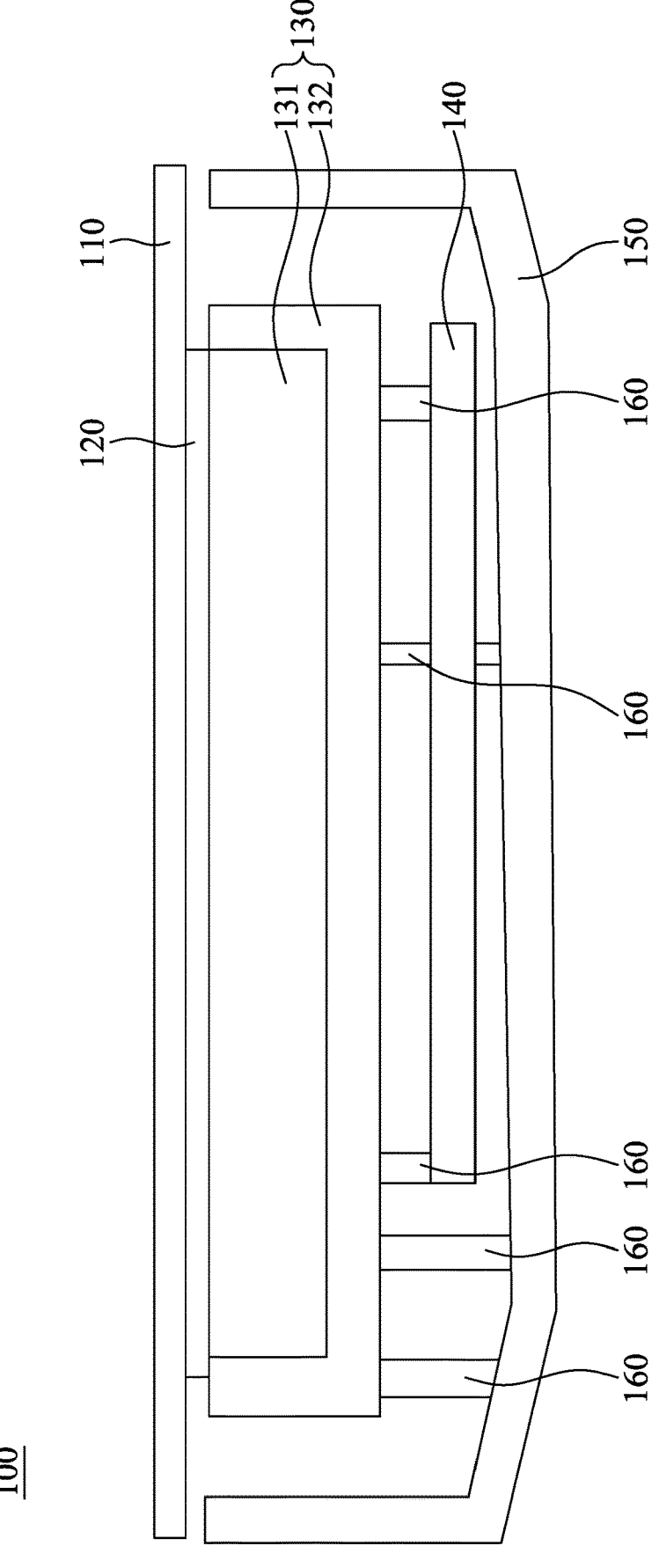
FIG. 1 schematically illustrates a side view of an electronic device, in accordance with some embodiments.

The following description provides many different embodiments, or examples, for implementing different features of the present disclosure. The elements and arrangements described in the following description are used for the sake of clear description of some embodiments of the present application. Of course, these are just examples and are not limiting. In addition, in different embodiments, similar and/or corresponding symbols may be used repeatedly. These similar and/or corresponding symbols are used for the sake of clear description of some embodiments of the present application, and they do not dictate any relationship between different embodiments and/or structures. Ordinal terms such as "first", "second", etc., used in the following description do not by themselves connote any priority, precedence, or order of one element over another, but are used merely as labels to distinguish one element from another element having the same name. Therefore, a first element in the description may be referred to as a second element in the claims.

The present disclosure can be more fully understood by reading the following description and the accompanying drawings. The number and sizes of elements illustrated in the accompanying drawings are for the sake of clarity and are not limiting. It should be noted that elements and devices may exist in various forms. Spatially relative terms, such as "above," "below," "upper," "lower," etc., may be used in the following description for the sake of clear description to describe one element or feature's positional relationship to another element or feature. If a device of the drawings is flipped upside down, an element that is "above" will become an element that is "below". In addition, when describing a first feature is formed above the second feature, the embodiments that the first feature is in direct contact with the second feature are included, and the embodiments that another feature is formed between the first feature and the second feature so the first feature is not in direct contact with the second feature are also included.

In the following description, the terms "comprising," "including," and/or "having," etc., should be interpreted as "including but not limited to . . . ". Therefore, when the terms "comprising," "including," and/or "having," etc., are used in the description of the present disclosure, the presence of corresponding features, regions, steps, operations and/or components is specified, and without excluding the presence of one or more other features, regions, steps, operations and/or components. In addition, the terms "about" or "substantially" are generally interpreted as within 10%, 5%, 3%, 2%, 1%, or 0.5% of a given value or range. In addition, the wording "the range is between a first value and a second value" represents that the range includes the first value, the second value, and other values between the first value and the second value.

In the following description, the electronic device may include a display device, a backlight device, an antenna device, a sensing device, or a tiled device, but it is not limited thereto. The electronic device may include a bendable or a flexible electronic device. The display device may be a self-emissive display device or a non-self-emissive display device, but it is not limited thereto. The antenna device may be a liquid crystal (LC) type antenna device or a non-liquid-crystal-type antenna device, but it is not limited thereto. The sensing device may be a sensing device that is capable of sensing capacitance, light, thermal energy, or ultrasonic sounds, but it is not limited thereto. The electronic element may include a passive element and an active element, such as a capacitor, a resistor, an inductor, a diode, a transistor, and the like. The diode may include a light-emitting diode (LED) or a photodiode. The light-emitting diode may include an organic light-emitting diode (OLED), a mini LED, a micro LED, or a quantum dot (QD) LED (QDLED, which may also be referred to as QLED), but it is not limited thereto. The tiled device may be a display tiled device or antenna tiled device, but it is not limited thereto. It should be noted that the electronic device may be combinations of the aforementioned electronic devices, but it is not limited thereto. In the following description, the display device may be used as an example of the electronic device, but the present disclosure is not limited thereto.

In the present disclosure, the wording "gap" represents an open hole formed on the edge of an element, while the wording "through-hole" represents a closed hole that completely passes through an element. Similar elements will be denoted by similar symbols.

Please refer to FIG. 1. FIG. 1 schematically illustrates a side view of an electronic device 100, in accordance with some embodiments. The electronic device 100 includes a capping substrate 110, a panel 120, a backlight unit 130, a circuit board 140, a back plate 150, and a plurality of connecting elements 160. Elements may be added to the electronic device 100 or may be omitted from the electronic device 100 according to actual needs.

The capping substrate 110 is disposed above the panel 120, the backlight unit 130, the circuit board 140, and the back plate 150. The capping substrate 110 may provide protection. The capping substrate 110 may include a hard substrate or a flexible substrate. The material of the capping substrate 110 may include glass, quartz, polycarbonate (PC), polyimide (PI), polypropylene (PP), polyethylene terephthalate (PET), another material or a combination thereof, but the material of the capping substrate 110 is not limited thereto.

The panel 120 is disposed above the back plate 150. In detail, the panel 120 is disposed between the capping substrate 110 and the back plate 150. The panel 120 may be used for displaying. The panel 120 may include a self-emissive panel or a non-self-emissive panel, but it is not limited thereto. The self-emissive panel may include an OLED, a mini LED, a micro LED, or a QD LED, but it is not limited thereto. The non-self-emissive panel may include liquid crystal or another suitable material. For example, the panel 120 may include two substrates (not illustrated), a display medium layer (not illustrated), a driving circuit layer (not illustrated), and the like. The display medium layer may be disposed between the two substrates. The material of the substrates may include, for example, glass, quartz, PC, PI, PP, PET, another suitable material, or a combination thereof, but the material of the substrates is not limited thereto. In some embodiments, the panel may include one substrate, a LED, and other film layers, and the LED is disposed on the substrate.

The driving circuit layer may include transistors (such as switch transistors, driving transistors, or other transistors), data lines, scan lines, dielectric layers, or other wires, but the components included in the driving circuit layer are not limited thereto. The display medium layer may include liquid crystal or LED. The types of liquid crystal may include, for example, twisted nematic (TN) liquid crystal, super twisted nematic (STN) liquid crystal, vertical alignment (VA) liquid crystal, in-plane switching (IPS) liquid crystal, cholesteric liquid crystal, fringe field switching (FFS) liquid crystal, another suitable type of liquid crystal, or a combination thereof, but the types of liquid crystal are not limited thereto. As described above, an LED may include, for example, an OLED, a mini LED, a micro LED, or a QD LED, but it is not limited thereto.

The backlight unit 130 may include a film group 131 and a heat dissipation element 132. The film group 131 is disposed between the panel 120 and the back plate 150. The film group 131 may include one or more optical films. In some embodiments, any two adjacent optical films may be in contact with each other or not in contact with each other. For example, there may be an air layer or another layer (or an element) between any two adjacent optical films, such as an adhesive layer, but the examples of the layer between any two adjacent optical films are not limited thereto.

In some embodiments, the film group 131 may further include one or more diffusion films. The diffusion films may be made by various methods or be made of various materials. In some embodiments, the diffusion films may be made by coating mixtures of light diffusion materials on the optical films, forming concave and convex structures on the optical films, adding scatter particles, diffusion particles, or refraction particles to the interior of the optical films, adding air-filled or gas-filled hollow beads or polymeric particles to the interior of the optical film, or the diffusion films may be made of optical films with micro holes inside, but the formation of the diffusion films is not limited thereto. In some embodiments, diffusion films and optical films are arranged alternately, but the arrangement is not limited thereto.

The heat dissipation element 132 is disposed between the panel 120 and the back plate 150. The heat dissipation element 132 may dissipate heat. In some embodiments, the heat dissipation element 132 is a heat exchanger, such as a heat pipe heat exchanger, a fin heat exchanger, but it is not limited thereto.

The circuit board 140 is disposed relative to the back plate 150. For example, the circuit board 140 may be disposed between the back plate 150 and the backlight unit 130, or, the circuit board 140 may be disposed between the panel 120 and the backlight unit 130, but the position of the circuit board 140 is not limited thereto. The circuit board 140 may be electrically connected to the panel 120 and/or the backlight unit 130. The circuit board 140 may be used for placing electronic elements (such as an electronic element 170, which will be described below). The electronic elements may include a passive element and an active element, including but not limited to the aforementioned capacitors, resistors, inductors, diodes, transistors, and the like.

The back plate 150 need not to be the bottommost element or the outermost element of the electronic device 100. In some embodiment, there are other elements below the back plate 150 or outside the back plate 150. The back plate 150 may dissipate heat or provide support for other elements. In some embodiments, the back plate 150 may include plastics, metal (including stainless steel, magnesium alloys, aluminum alloys, other metal, or metal alloys), ceramic, another suitable material, or a combination thereof, but the material of the back plate 150 is not limited thereto. The back plate 150 may be made by injection molding, insert molding, stamping, or another suitable method, but the forming methods of the back plate 150 are not limited thereto.

In some embodiments, if the back plate 150 is the bottommost element or the outermost element of the electronic device 100, the circuit board 140 may be disposed on the inner side of the back plate 150. In some other embodiments, if there are other elements disposed below or on the outer side of the back plate 150, the circuit board 140 may be selectively disposed on either the inner side or the outer side of the back plate 150, but the positional relationship between the back plate 150 and the circuit board 140 is not limited thereto.

The connecting elements 160 may be used for connecting different elements to each other. The connecting elements 160 may be screws, ribs, protrusions, but the connecting elements 160 are not limited thereto. The connecting elements 160 may be used for affixing the back plate 150 to the backlight unit 130, affixing the circuit board 140 to the backlight unit 130, and affixing the back plate 150, the circuit board 140, and the backlight unit 130 to each other at the same time. Details of the connecting elements 160 will be described with reference made to FIG. 8.

It should be noted that, in FIG. 1, the backlight unit 130 and the circuit board 140 are schematically illustrated as having a flat structure. However, for miniaturization of the electronic device 100, and/or increasing the area of the panel 120, and/or other reasons, it may be desirable to reduce the space between the panel 120 and the back plate 150 and/or provide a larger circuit board 140. Therefore, there may be a need to bend the circuit board 140.

Figure 2:
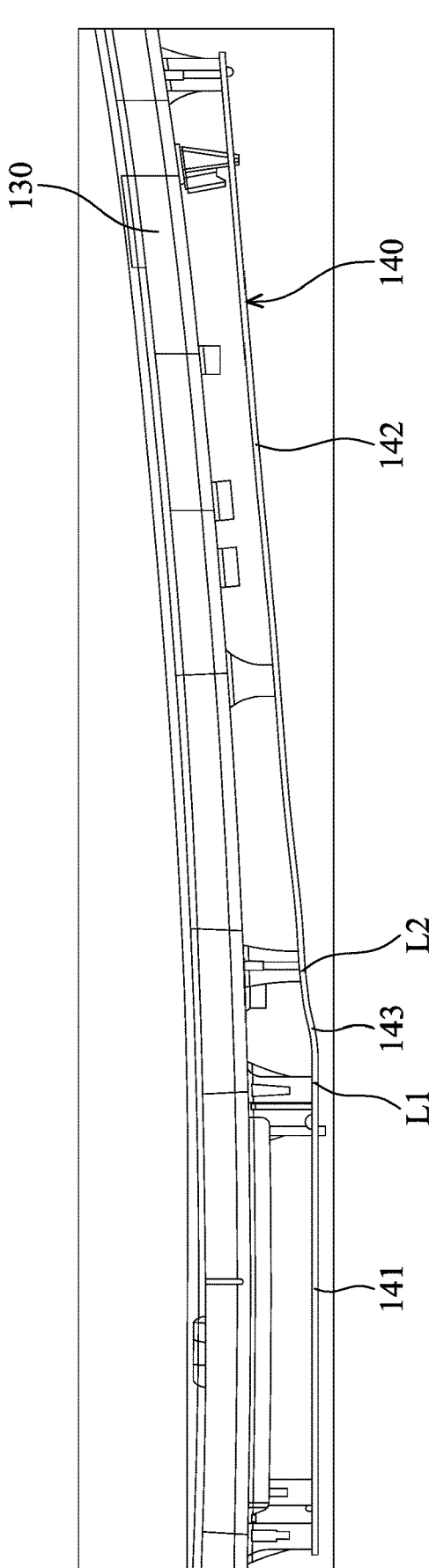
FIG. 2 schematically illustrates a side view of a backlight unit and a circuit board, in accordance with some embodiments.

Please refer to FIG. 2. FIG. 2 schematically illustrates a side view of the backlight unit 130 and the circuit board 140 for showing the bent circuit board 140, in accordance with some embodiments. In this embodiment, the circuit board 140 includes a first flat zone 141, a second flat zone 142, a flexible zone 143 disposed between the first flat zone 141 and the second flat zone 142. The flexible zone 143 may be connected to the first flat zone 141 and the second flat zone 142. When the circuit board 140 has to be bent due to requirements for the electronic device 100, the flexible zone 143 is the part of the circuit board 140 that mainly creates bending. As for the first flat zone 141 and the second flat zone, they have smaller bendability compared to the flexible zone 143. In this embodiment, the circuit board 140 includes two flat zones (i.e., the first flat zone 141 and the second flat zone 142) and one flexible zone (i.e., the flexible zone 143). However, the circuit board 140 may include more bendable zones. That is, the circuit board 140 may include more flat zones and more flexible zones. The differences between the flat zones and the flexible zones will be further described with reference made to FIG. 4 to FIG. 7, which related to the embodiments include the electronic element 170.

In some embodiments, the entire circuit board 140 includes the same material, and the entire circuit board 140 may be formed integrally. For example, the circuit board 140 may include a rigid board, a flex board, but it is not limited thereto.

Figure 3:
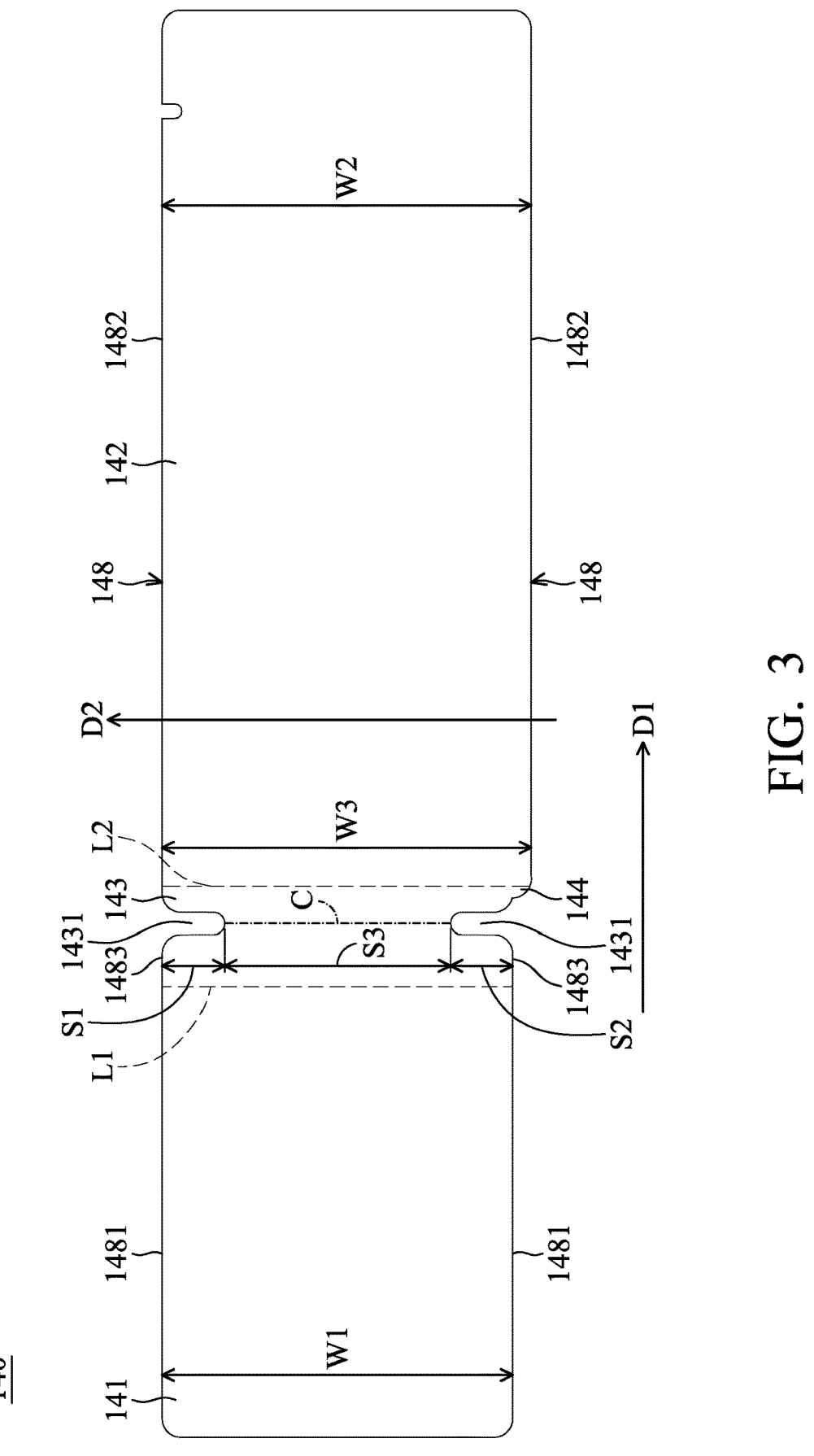
FIG. 3 to FIG. 8 schematically illustrate top views of a circuit board, in accordance with some embodiments.

Next, please refer to FIG. 3. FIG. 3 schematically illustrates a top view of the circuit board 140. For ease of illustration, the dotted line L1 is used for showing the boundary line between the first flat zone 141 and the flexible zone 143, and the dotted line L2 is used for showing the boundary line between the second flat zone 142 and the flexible zone 143. The dotted line L1 and the dotted line L2 are imaginary lines showing separation between different zones, and they are not limiting.

The circuit board 140 has two edges 148 corresponding to each other. The two edges 148 both extend along a first direction D1. When the circuit board 140 is not bent, the first direction D1 may be parallel with, such as, the direction along which the first flat zone 141, the second flat zone 142, the flexible zone 143 are oriented. In addition, the corresponding parts of the two edges 148 that are in the first flat zone 141 may be defined as two first flat zone edges 1481. The corresponding parts of the two edges 148 that are in the second flat zone 142 may be defined as two second flat zone edges 1482. The corresponding parts of the two edges 148 that are in the flexible zone 143 may be defined as two flexible zone edges 1483. When the circuit board 140 is bent, the first direction D1 may correspond to the extending directions of different zones. For example, the first direction D1 in the first flat zone 141 is the extending direction of the two first flat zone edges 1481, the first direction D1 in the second flat zone 142 is the extending direction of the two second flat zone edges 1482, and the first direction D1 in the flexible zone 143 is the extending direction of the two flexible zone edges 1483, but the definition of the first direction D1 is not limited thereto.

Furthermore, the circuit board 140 includes a second direction D2 that is perpendicular to the first direction D1. It should be noted that the circuit board 140 illustrated in FIG. 3 to FIG. 8 has not been bent yet, the actual flexible zone 143 may be inclined relative to the horizontal plane (as shown in FIG. 2). Therefore, the first direction D1 may not be the horizontal direction. When "the first direction D1" is described in the specification and the claims, the actual extending directions of the first flat zone edges 1481, the second flat zone edges 1482, and the flexible zone edge 1483 may be referred to.

The first flat zone 141 has a first width W1. In some embodiments, the first width W1 is the distance between the two first flat zone edges 1481 (that are opposite to each other) along the second direction D2. The second flat zone 142 has a second width W2. In some embodiments, the second width W2 is the distance between the two second flat zone edges 1482 (that are opposite to each other) along the second direction D2. In some embodiments, since the distance between the two first flat zone edges 1481 (that are opposite to each other) along the second direction D2 is different from the distance between the two second flat zone edges 1482 (that are opposite to each other) along the second direction D2, the first width W1 is different from the second width W2. In some embodiments, since the first width W1 is less than the second width W2, a buffer structure 144 may be formed on the part of the flexible zone 143 that is closer to the wider second flat zone 142, thereby decreasing the possibility of non-uniform stress caused by different widths of the first flat zone 141 and the second flat zone 142. In some embodiments, the buffer structure 144 is a structure that includes a rounded chamfer.

In some embodiments, two flexible zone gaps 1431 may be formed on the two flexible zone edges 1483, respectively. In some embodiments, the length of any of the flexible zone gaps 1431 along the first direction D1 is less than its length along the second direction D2. In some embodiments, the two flexible zone gaps 1431 are substantially the same. In some embodiments, each flexible gap 1431 has a curved shape, which may reduce stress in the circuit board 140. The curved shape included in the flexible zone gaps 1431 may be the curved shape illustrated in FIG. 3, but it is not limited thereto. In some embodiments, the two flexible zone gaps 1431 are formed on the two flexible zone edges 1483, respectively, and the two flexible zone gaps 1431 are symmetrical. That is, a central line C may pass through the symmetrical flexible zone gaps 1431. In some embodiments, the central line C may be substantially parallel with the second direction D2.

In some embodiments, one of the two flexible zone gaps 1431 that have the same central line C and are symmetrical may have a first length S1 along the second direction D2, and the other one may have a second length S2 along the second direction D2. The sum of the first length S1 and the second length S2 is less than half of the first width W1, but it is not limited thereto. That is, the total length of the two flexible zone gaps 1431 that have the same central line C and are symmetrical is less than half of the first width W1 of the first flat zone 141.

In some embodiments, one of the two flexible zone gaps 1431 that have the same central line C and are symmetrical may have a first length S1 along the second direction D2, and the other one may have a second length S2 along the second direction D2. The sum of the first length S1 and the second length S2 is less than half of the second width W2, but it is not limited thereto. That is, the total length of the two flexible zone gaps 1431 that have the same central line C and are symmetrical is less than half of the second width W2 of the first flat zone 141.

In some embodiments, the flexible zone 143 has a third width W3. In some embodiments, the third width W3 is the distance between the two flexible zone edges 1483 (that are opposite to each other) along the second direction D2. For example, the third width W3 may be the maximum length of the flexible zone 143 along the second direction D2. In some embodiments, the third width W3 is substantially the same as the first width W1 or the second width W2. In some embodiments, one of the two flexible zone gaps 1431 that have the same central line C and are symmetrical may have a first length S1 along the second direction D2, and the other one may have a second length S2 along the second direction D2. The sum of the first length S1 and the second length S2 is less than half of the third width W3.

In some embodiments, the minimum length S3 of the flexible zone 143 along the second direction D2 is greater than at least one of half the first width W1, half of the second width W2, and half the third width W3. As a result, the structural strength of the flexible zone 143 may be ensured.

Due to the flexible zone gaps 1431, the structural strength of the flexible zone 143 may be decreased, so the circuit board 140 may be easily bent and/or the possibility that the circuit board 140 is broken or damaged may be reduced. That is, since the flexible zone 143 is the part of the circuit board 140 that can be bent, its flexural strength may be less than the flexural strength of the first flat zone 141 and the flexural strength of the second flat zone 142. Flexural testing may be conducted according to ASTM D790 Flexural Test or ISO 178 standard, flexural testing may also be conducted using a universal tensile machine to test deformation behavior of the material when it does not fracture (e.g., when the strain is about 5%), or flexural testing may be conducted by measuring flexural modulus within the elastic range, but the flexural testing is not limited thereto. In addition, since the total length of the two flexible zone gaps 1431 along the second direction D2 is designed to be less than half of a certain flat zone of the circuit board, it is ensured that while the structural strength of the flexible zone 143 is reduced, the flexible zone 143 still has sufficient structural strength. Therefore, the possibility that the circuit board 140 is broken or damaged caused by the flexible zone gaps 1431 may be reduced.

Next, please refer to FIG. 4 to FIG. 7. FIG. 4 to FIG. 7 schematically illustrate top views of the circuit board 140, in which the electronic device 100 further includes the electronic element 170 disposed on the circuit board 140, in accordance with some embodiments. The electronic element 170 may be disposed in the first flat zone 141 or the second flat zone 142, and it is not disposed in the flexible zone 143. In detail, the flexible zone 143 may only include layout, and no electronic element 170 is disposed on the flexible zone 143, thereby reducing the possibility that signal transmission is weak. The size of the flexible zone 143 may be determined according to actual needs. If the flexible zone 143 is larger, it is easier to bend the circuit board 140. If the flexible zone 143 is smaller, it is easier to design the layout of the circuit board 140.

Figure 4:
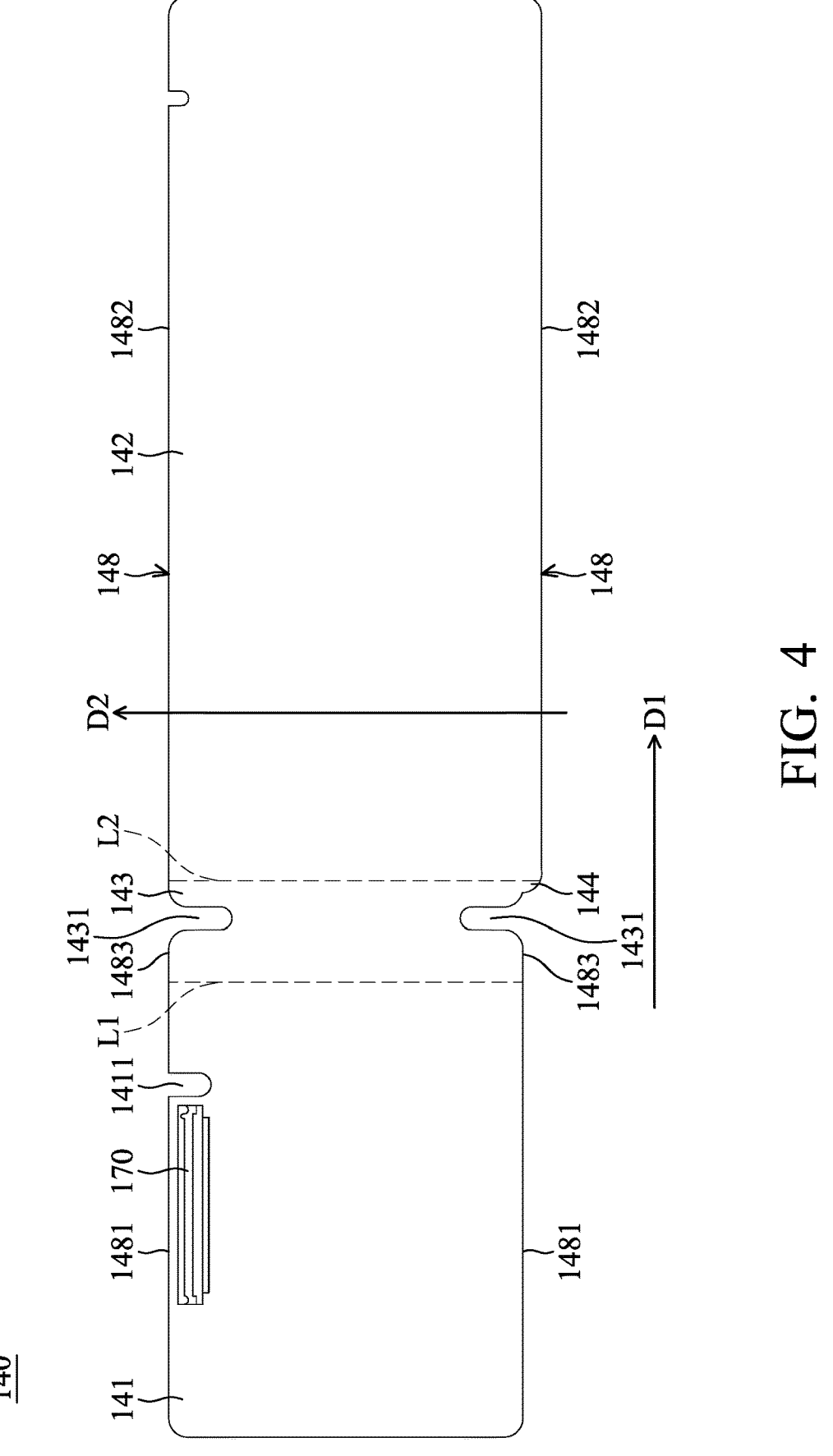

As shown in FIG. 4, in some embodiments, to reduce stress transfer around the electronic element 170, a flat zone gap 1411 may be formed on the first flat zone edge 1481 or the second flat zone edge 1482. In some embodiments, the flat zone gap 1411 is formed close to the electronic element 170. In particular, the flat zone gap 1411 is formed "close to" the electronic element 170 may include embodiments that the electronic element 170 is disposed in the first flat zone 141 or the second flat zone 142, the flat zone gap 1411 is formed near the electronic element 170, and there are no elements between the electronic element 170 and the flat zone gap 1411. In some embodiments, the distance between the electronic element 170 and the flat zone gap 1411 is greater than 1 mm, so the flat zone gap 1411 does not affect the electronic element 170. In some embodiments, the length of the flat zone gap 1411 along the second direction D2 is less than the length of each flexible zone gap 1431 along the second direction D2.

Figure 5:
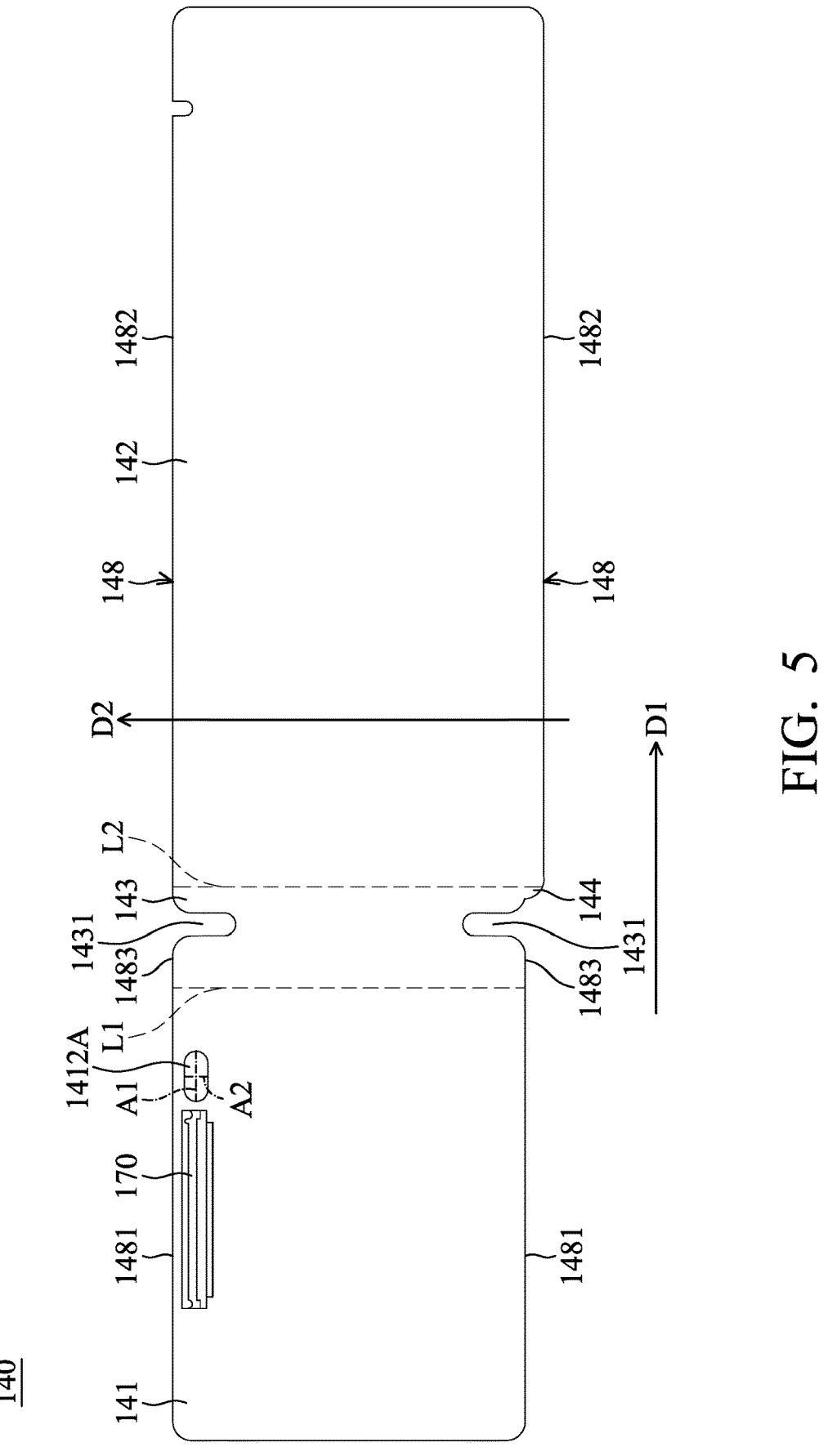
Figure 6:
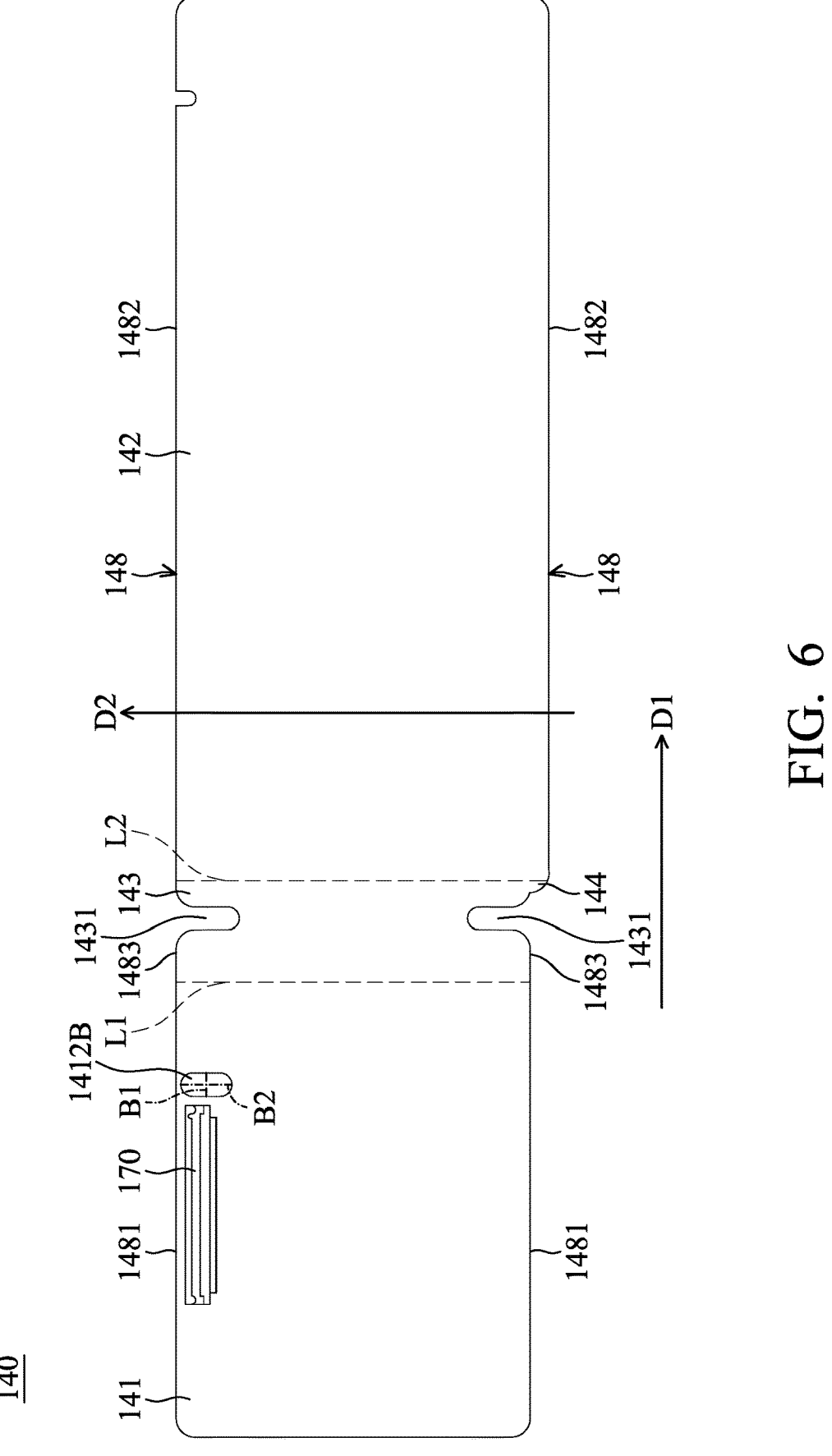
Figure 7:
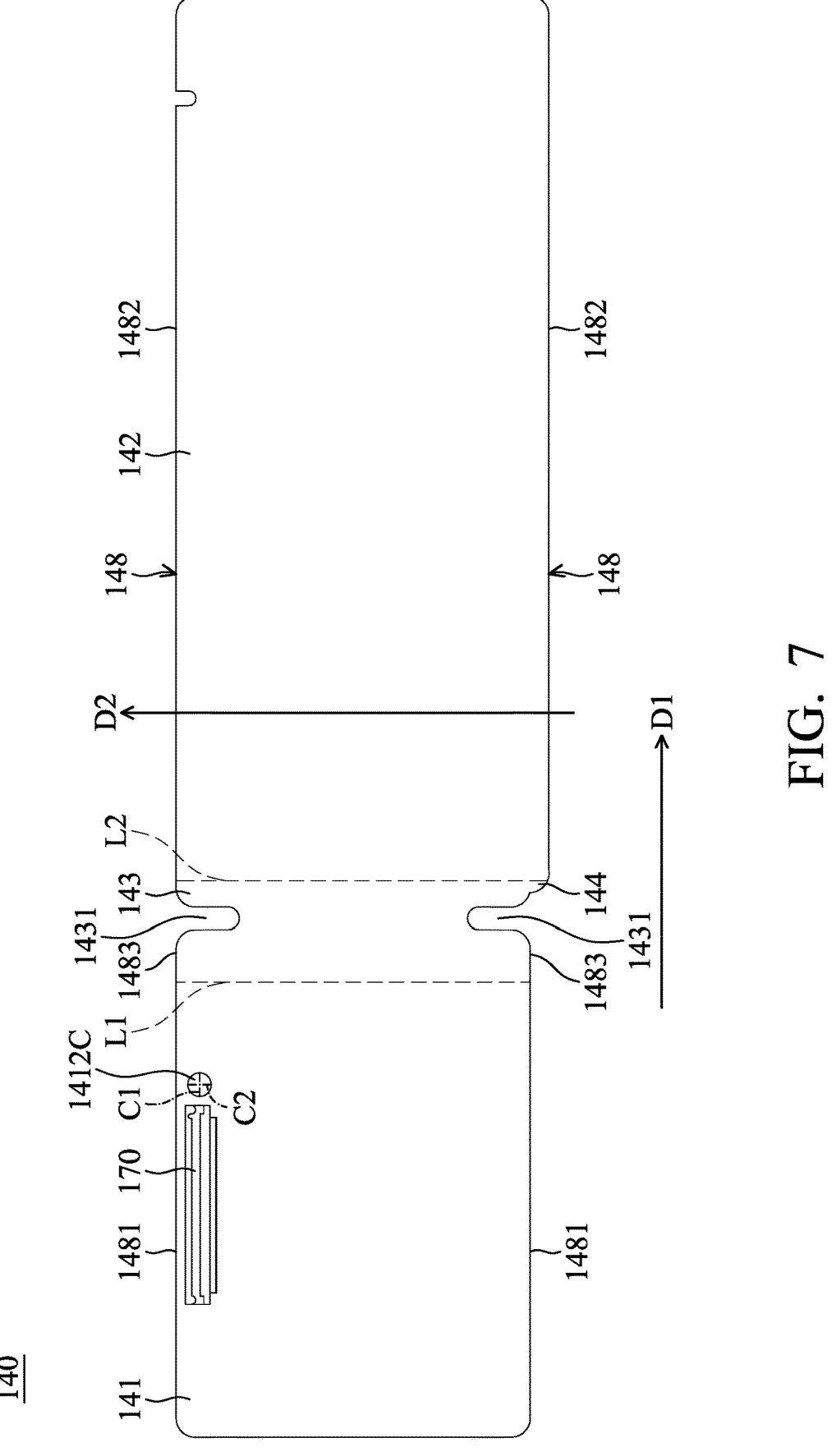

As shown in FIG. 5 to FIG. 7, to reduce stress transfer around the electronic element 170, a through-hole 1412A, a through-hole 1412B, or a through-hole 1412C may be formed on the first flat zone 141 or the second flat zone 142. In some embodiments, the through-hole 1412A, the through-hole 1412B, or the through-hole 1412C is formed close to the electronic element 170. In particular, the through-hole 1412A, the through-hole 1412B, or the through-hole 1412C is formed "close to" the electronic element 170 may include embodiments that the electronic element 170 is disposed in the first flat zone 141 or the second flat zone 142, the through-hole 1412A, the through-hole 1412B, or the through-hole 1412C is formed near the electronic element 170, and there are no elements between the electronic element 170 and the through-hole 1412A, the through-hole 1412B, or the through-hole 1412C. In some embodiments, the distance between the electronic element 170 and the through-hole 1412A, the through-hole 1412B, or the through-hole 1412C is greater than 1 mm. In some embodiments, the length of the through-hole 1412A, the through-hole 1412B, or the through-hole 1412C along the second direction D2 is less than the length of each flexible zone gap 1431 along the second direction D2.

In the embodiments illustrated in FIG. 5, the through-hole 1412A may include a first axis A1 and a second axis A2 intersecting the first axis A1. The first axis A1 is parallel with the first direction D1, and the second axis A2 is parallel with the second direction D2. The length of the through-hole 1412A along the first axis A1 is greater than the length of the through-hole 1412A along the second axis A2. In the embodiments illustrated in FIG. 6, the through-hole 1412B
may include a first axis B1 and a second axis B2 intersecting
the first axis B1. The first axis B1 is parallel with the first
direction D1, and the second axis B2 is parallel with the
second direction D2. The length of the through-hole 1412B
along the first axis B1 is less than the length of the
through-hole 1412B along the second axis B2. The through-
hole 1412A and the through-hole 1412B may be an oblong
hole, having two semicircles connected by two parallel
straight lines. The longer one of the first axis A1 and the
second axis A2 (or the longer one of the first axis B1 and the
second axis B2) may be the connecting line connecting the
two semicircles, and the shorter one of the first axis A1 and
the second axis A2 (or the shorter one of the first axis B1 and
the second axis B2) may be perpendicular to the two parallel
straight lines.

In the embodiments illustrated in FIG. 7, the through-hole
1412C may include a first axis C1 and a second axis C2
intersecting the first axis C1. The first axis C1 is parallel with
the first direction D1, and the second axis C2 is parallel with
the second direction D2. The length of the through-hole
1412C along the first axis C1 is substantially the same as the
length of the through-hole 1412C along the second axis C2.
The through-hole 1412C may be a round hole, and the length
of the first axis C1 is substantially the same as the length of
the second axis C2.

Due to the flat zone gap 1411 and/or the through-hole
1412A, the through-hole 1412B, or the through-hole 1412C
that are close to the electronic element 170, stress transfer
around the electronic element 170 may be reduced, thereby
reducing the possibility that the electronic element 170
breaks or drops off the circuit board 140 (for example,
because of too much force applied on the electronic element
170) during the bending of the circuit board 140.

For ease of illustration, only one electronic element 170,
only one flat zone gap 1411, and/or only one through-hole
1412A, through-hole 1412B, or through-hole 1412C are
illustrated in FIG. 4 to FIG. 7. However, more electronic
elements 170 may be disposed on the first flat zone 141
and/or the second flat zone 142, and more flat zone gap 1411,
and/or through-hole 1412A, through-hole 1412B, or
through-hole 1412C may be formed correspondingly.

Figure 8:
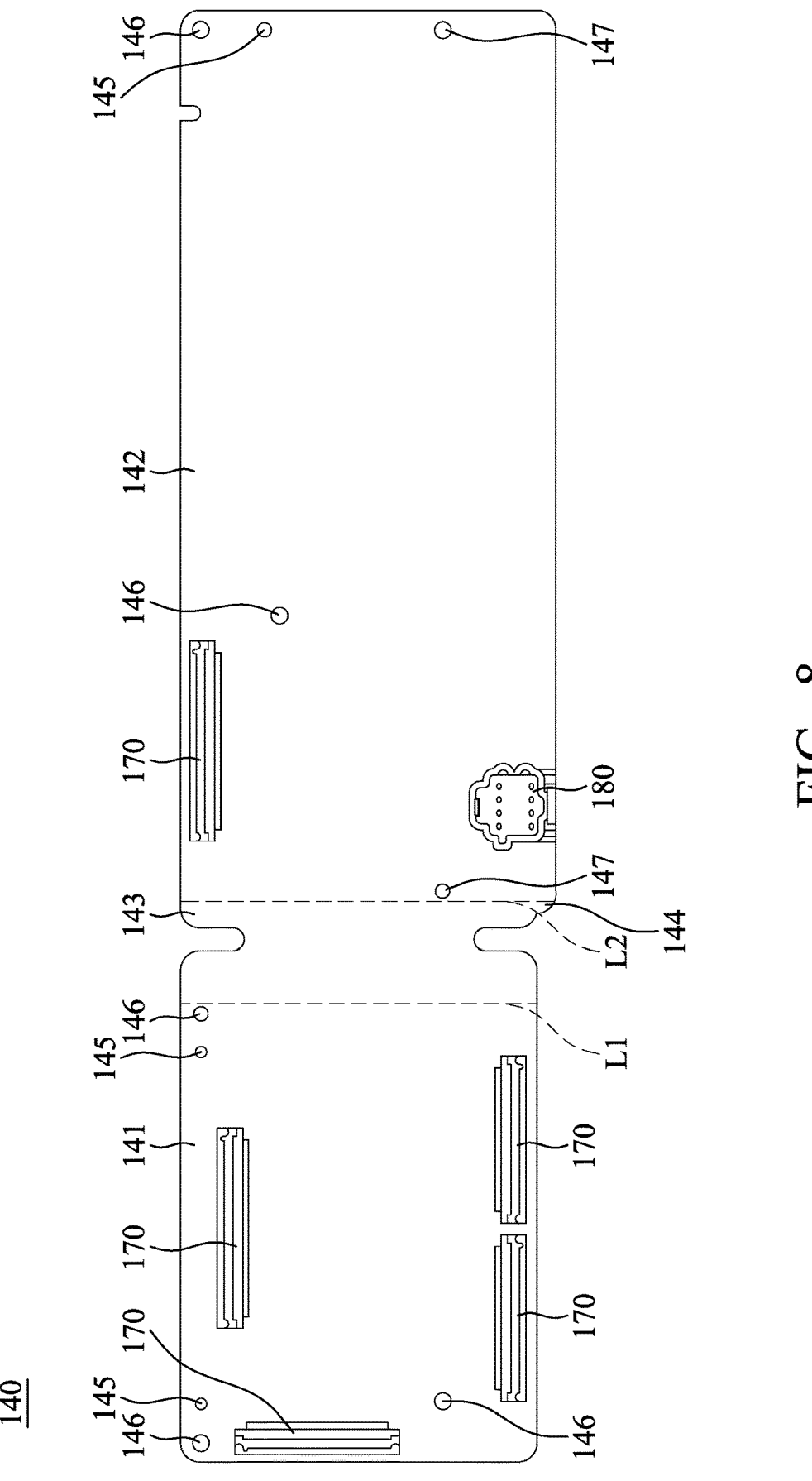

It should be noted that in addition to the flat zone gap
1411, and/or through-hole 1412A, through-hole 1412B, or
through-hole 1412C, other gaps or holes may be formed on
the circuit board 140. For example, the circuit board 140
may further include a plurality of connecting holes 145, 146,
147 to strengthen the connection and fixation between
different elements. Next, please refer to FIG. 1 and FIG. 8.
FIG. 8 schematically illustrates a top view of the circuit
board 140, in which the electronic device 100 includes
multiple electronic elements 170 and another electronic
element 180, in accordance with some embodiments. The
electronic element 180 is different from the electronic ele-
ments 170. The connecting holes 145, 146, 147 are closed
holes that completely pass through the circuit board 140, so
that the connecting elements 160 may pass through the
connecting holes 145, 146, 147.

In some embodiments, the backlight unit 130 has posi-
tioning portions (not illustrated) corresponding to the con-
necting holes 145. For example, the positioning portions
may be protrusions, but the structures of the positioning
portions are not limited thereto. The connecting holes 145
may pass through the positioning portions of the backlight
unit 130, so the positioning portions may be used for
positioning. In addition, during the assembly of the circuit
board 140, the circuit board 140 may be stable, thereby reducing the possibility that the circuit board 140 vibrates or
shakes. To ensure the backlight unit 130 is positioned
relative to the circuit board 140, the sizes of the connecting
holes 145 may be less than the sizes of the connecting holes
146, 147, but the sizes of the connecting holes 145, 146, 147
are not limited thereto.

In some embodiments, the backlight unit 130 has holes
corresponding the connecting holes 146, and the connecting
elements 160 (such as the rightmost connecting element 160
in FIG. 1) may pass through the connecting holes 146 of the
circuit board 140 and the holes of the backlight unit 130 that
correspond to the connecting holes 146, thereby affixing the
circuit board 140 to the backlight unit 130.

In some embodiments, both the backlight unit 130 and the
back plate 150 have holes corresponding to the connecting
holes 147, and the connecting elements 160 (such as the
second from the right connecting element 160 in FIG. 1)
may pass through the holes of the back plate 150 that
correspond to the connecting holes 147, the connecting
holes 147 of the circuit board 140, and the holes of the
backlight unit 130 that correspond to the connecting holes
147, thereby affixing the back plate 150, the circuit board
140, and the backlight unit 130 at the same time.

In some embodiments, the backlight unit 130 and the back
plate 150 have holes corresponding to each other, and the
connecting elements 160 (such as the leftmost connecting
element 160 in FIG. 1) may pass through the holes of the
backlight unit 130 and the holes of the back plate 150 that
are correspond to each other, thereby directly affixing the
back plate 150 to the backlight unit 130.

It should be noted that, in some embodiments, one or
more of the connecting holes 145, 146, 147 may be omitted,
and replaced with the through-hole 1412A, the through-hole
1412B, or the through-hole 1412C. Since the through-hole
1412A, the through-hole 1412B, and the through-hole
1412C are also closed holes, the connecting elements 160
may pass through the through-hole 1412A, the through-hole
1412B, and the through-hole 1412C to affix the circuit board
140. That is, the through-hole 1412A, the through-hole
1412B, and the through-hole 1412C may also be used for
reducing stress transfer and strengthening connection
between elements.

In embodiments where the through-hole is an oblong hole
(e.g., the through-hole 1412A and the through-hole 1412B),
since the connecting element 160 may be movable in the
through-hole, assembly tolerance may be compensated. In
embodiments where the through-hole is a round hole (e.g.
the through-hole 1412C), there may be a close fit between
the through-hole and the connecting element 160 therein, so
the assembly strength is increased.

In some embodiments, the flexible zone gaps 1431, the
connecting holes 145, 146, 147, the flat zone gap 1411, and
the through-hole 1412A, 1412B, 1412C may be formed by
methods such as laser ablation, cutting, stamping, sawing,
milling, polishing, and the like, but the forming methods are
not limited thereto.

As described above, the electronic device of the present
disclosure includes a bendable circuit board. The circuit
board may include flat zones and a flexible zone between the
flat zones. The electronic element is disposed in the flat
zone, and it is not disposed in the flexible zone, thereby
reducing the possibility that signal transmission is weak. To
reduce the possibility that the circuit board is broken or
damaged during the bending of the circuit board, a flexible
zone gap may be formed in the flexible zone. Therefore, the
structural strength of the flexible zone is decreased, and it
may be easier to bend the circuit board. In addition, the size of the flexible zone gap along a certain direction may be designed to be less than half of the width of a certain flat zone and/or half of the width of the flexible zone to ensure the flexible zone still has sufficient structural strength. Furthermore, a flat zone gap and a through-hole may be formed on the circuit board to reduce the possibility that the electronic element breaks or drops off the circuit board (for example, because of too much force applied on the electronic element) during the bending of the circuit board and/or strengthen the connection between different elements.

It should be noted that various changes, substitutions, and alterations may be made to the embodiments herein without departing from the spirit and scope of this disclosure to accomplish other embodiments. As long as the features of different embodiments do not depart from the spirit and scope of this disclosure, the features may be arbitrarily combined.

The foregoing outlines features of several embodiments, so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should realize that such equivalent constructions do not depart from the spirit and scope of this disclosure, and that they may make various changes, substitutions, and alterations herein without departing from the spirit and scope of this disclosure.

What is claimed is:

1. An electronic device, comprising:
   a back plate; and
   a circuit board having two edges corresponding to each other and extending along a first direction, wherein the circuit board is disposed relative to the back plate, and the circuit board comprises:
   a first flat zone having a first width;
   a second flat zone having a second width;
   a flexible zone disposed between the first flat zone and the second flat zone and connected to the first flat zone and the second flat zone, wherein the flexible zone comprises two flexible zone edges corresponding to each other, and the two flexible zone edges are corresponding parts of the two edges that are in the flexible zone; and
   two flexible zone gaps formed on the two flexible zone edges, respectively, wherein the two flexible zone gaps extend along a second direction that is perpendicular to the first direction, one of the two flexible zone gaps has a first length along the second direction, and the other one of the two flexible zone gaps has a second length along the second direction, and sum of the first length and the second length is less than half of the first width,
   wherein the first width is less than the second width, and a buffer structure is formed on part of the flexible zone that is closer to the second flat zone.

2. The electronic device as claimed in claim 1, wherein each of the two flexible zone gaps has a curved shape.

3. The electronic device as claimed in claim 1, further comprising an electronic element and a flat zone gap, wherein the electronic element is disposed in the first flat zone or the second flat zone, the flat zone gap is formed on a first flat zone edge or a second flat zone edge, the flat zone gap is close to the electronic element, the first flat zone edge is parts of the two edges that are in the first flat zone, and the second flat zone edge is parts of the two edges that are in the second flat zone.

4. The electronic device as claimed in claim 3, wherein a distance between the flat zone gap and the electronic element is greater than 1 mm.

5. The electronic device as claimed in claim 3, further comprising a through-hole, wherein the through-hole is formed in the first flat zone or the second flat zone, and the through-hole is close to the electronic element.

6. The electronic device as claimed in claim 5, wherein the through-hole is a round hole.

7. The electronic device as claimed in claim 5, wherein the through-hole has a first axis and a second axis intersecting the first axis, and the first axis is either parallel with or perpendicular to the first direction.

8. The electronic device as claimed in claim 7, wherein a length of the through-hole along the first axis is different from a length of the through-hole along the second axis.

9. The electronic device as claimed in claim 5, further comprising a panel, a connecting element, and a backlight unit disposed between the back plate and the panel, wherein the connecting element passes through the through-hole to affix the circuit board to the backlight unit.

10. The electronic device as claimed in claim 1, wherein the buffer structure comprises a rounded chamfer.

11. The electronic device as claimed in claim 1, wherein the two flexible zone gaps are symmetrical.

12. An electronic device, comprising:
   a back plate; and
   a circuit board having two edges corresponding to each other and extending along a first direction, wherein the circuit board is disposed relative to the back plate, and the circuit board comprises:
   a first flat zone having a first width;
   a second flat zone having a second width;
   a flexible zone disposed between the first flat zone and the second flat zone and connected to the first flat zone and the second flat zone, wherein the flexible zone comprises two flexible zone edges corresponding to each other, and the two flexible zone edges are corresponding parts of the two edges that are in the flexible zone;
   two flexible zone gaps formed on the two flexible zone edges, respectively, wherein the two flexible zone gaps extend along a second direction that is perpendicular to the first direction, one of the two flexible zone gaps has a first length along the second direction, and the other one of the two flexible zone gaps has a second length along the second direction, and sum of the first length and the second length is less than half of the first width; and
   an electronic element and a flat zone gap, wherein the electronic element is disposed in the first flat zone or the second flat zone, the flat zone gap is formed on a first flat zone edge or a second flat zone edge, the flat zone gap is close to the electronic element, the first flat zone edge is parts of the two edges that are in the first flat zone, and the second flat zone edge is parts of the two edges that are in the second flat zone, and
   wherein a length of the flat zone gap along the second direction is less than a length of each of the two flexible zone gaps along the second direction.

13. An electronic device, comprising:
   a back plate; and
   a circuit board having two edges corresponding to each other and extending along a first direction, wherein the circuit board is disposed relative to the back plate, and the circuit board comprises:

a flat zone having a first width;

another flat zone having a second width; and a flexible zone disposed between the flat zone and the another flat zone and connected to the flat zone and the another flat zone, wherein the flexible zone comprises two flexible zone edges that correspond to each other and two flexible zone gaps formed on the two flexible zone edges, respectively, the two flexible zone edges are corresponding parts of the two edges that are in the flexible zone, and a flexural strength of the flexible zone is different from a flexural strength of the flat zone, wherein the first width is less than the second width, and a buffer structure is formed on part of the flexible zone that is closer to the another flat zone.

14. The electronic device as claimed in claim 13, wherein the flexural strength of the flexible zone is less than the flexural strength of the flat zone.

15. The electronic device as claimed in claim 13, wherein the flat zone has a flat zone width along a second direction that is perpendicular to the first direction, each of the two flexible zone gaps has a length along the second direction, and sum of the lengths of the two flexible zone gaps is less than half of the flat zone width.

16. The electronic device as claimed in claim 13, further comprising an electronic element disposed on the flat zone, wherein a through-hole is formed in the flat zone and close to the electronic element.

17. The electronic device as claimed in claim 16, wherein the through-hole has a length along a second direction that is perpendicular to the first direction, each of the two flexible zone gaps has a length along the second direction, and the length of the through-hole along the second direction is less than the length of each of the two flexible zone gaps along the second direction.

18. The electronic device as claimed in claim 13, further comprising a plurality of connecting holes formed in the flat zone, and the plurality of connecting holes have different sizes.

* * * * *